United States Patent [19]

Cordoba et al.

[11] Patent Number: 5,434,498
[45] Date of Patent: Jul. 18, 1995

[54] FUSE PROGRAMMABLE VOLTAGE CONVERTER WITH A SECONDARY TUNING PATH

[75] Inventors: Michael V. Cordoba; Kim C. Hardee, both of Colorado Springs, Colo.

[73] Assignees: United Memories, Inc., Colorado Springs, Colo.; Nippon Steel Semiconductor Corporation, Chiba, Japan

[21] Appl. No.: 991,533

[22] Filed: Dec. 14, 1992

[51] Int. Cl.⁶ ............................................. G05F 3/16
[52] U.S. Cl. ................................... 323/313; 327/541; 327/525
[58] Field of Search ........ 323/313, 312, 314, 315–317; 307/296.1, 296.6, 296.8, 296.2, 310

[56] References Cited

U.S. PATENT DOCUMENTS 4,860,256  8/1989  Devin et al. .................... 365/189.03
4,994,688  2/1991  Horiguchi et al. ................ 307/296.8

FOREIGN PATENT DOCUMENTS 4-102300  3/1992  Japan .

OTHER PUBLICATIONS

Horiguchi et al., "A Tunable CMOS-DRAM Voltage Limiter with Stabilized Feedback Amplifier," *IEEE Journal of Solid-State Circuits*, vol. 25, No. 5, pp. 1129–1135 (Oct. 1990).
Dual-Regulator Dual-Decoding-Trimmer DRAM Voltage Limiter for Burn-in Test, IEEE Journal of Solid-State Circuits, (1991) Nov., No. 11, New York, US pp. 1544–1549.

*Primary Examiner*—Steven L. Stephan
*Assistant Examiner*—Adolf Berhane
*Attorney, Agent, or Firm*—Edward D. Manzo

[57] ABSTRACT

In a fuse programmable voltage generator providing an optimal internal voltage VCCINT, a counter outputs various values to a voltage down comparator to output corresponding internal voltages VCCINT until a desired voltage is obtained. Once the desired internal voltage VCCINT is determined, the counter is disabled and a fuse circuit is configured to substantially maintain the output of the desired internal voltage VCCINT.

26 Claims, 14 Drawing Sheets

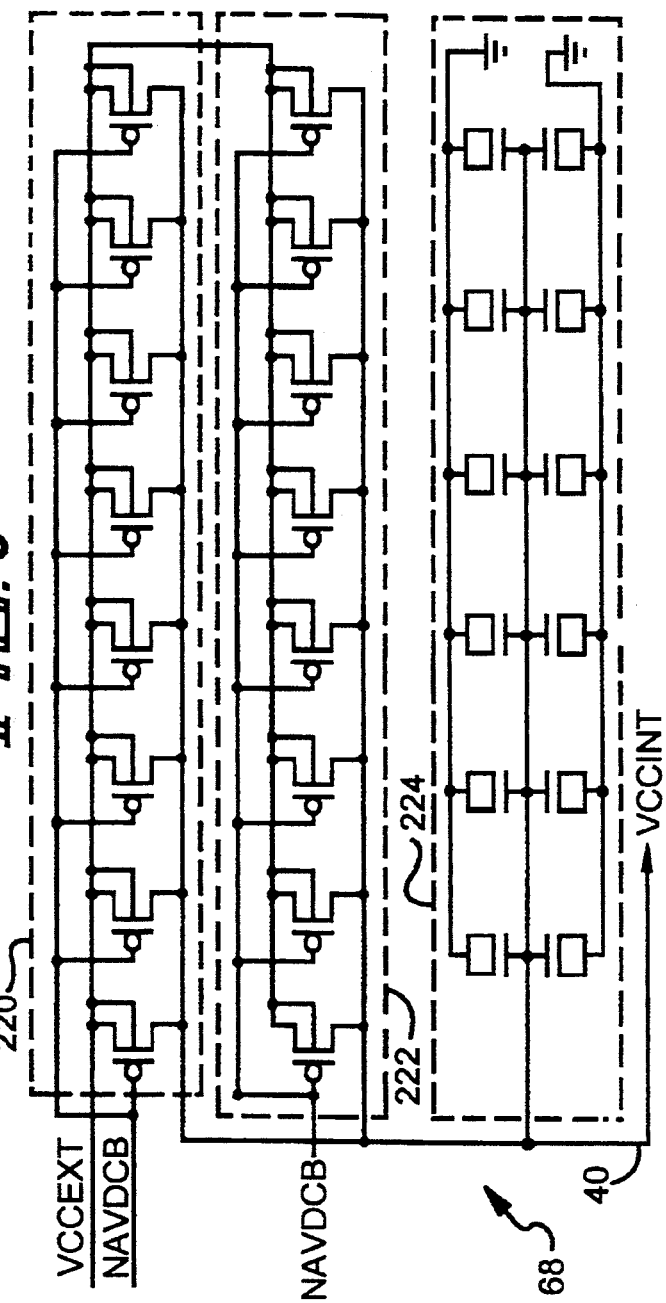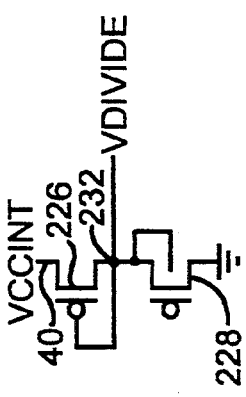

FUSE PROGRAMMABLE VOLTAGE CONVERTER WITH A SECONDARY TUNING PATH

FIELD OF THE INVENTION

The present invention relates to a fuse programmable voltage converter and, more particularly, to a voltage converter having a capability to preselect voltage levels prior to permanently setting the voltage output of the converter.

BACKGROUND OF THE INVENTION

Some recent semiconductor devices or integrated circuits require an internal operating voltage VCCINT which is not the same as an external supply voltage VCCEXT (an operating voltage supplied to the device or integrated circuit). Some of these devices, particularly high-density memories or circuits, require a lower internal operating voltage VCCINT because of the scaling down of the device sizes. In order to provide this internal voltage VCCINT, voltage generators have been used which can be trimmed by blowing fuses. Since the generated voltage can be trimmed down, such a converter is sometimes called a "voltage down converter" in the integrated circuit art.

An example of an internal voltage generator with trim capabilities is shown in FIG. 1. A reference voltage generator 400 supplies a reference voltage VREF to a voltage down converter ("VDC") designated by a block 402. VDC 402 provides an output signal on a line 404 to an internal voltage generator designated by a block 406. Generator 406 couples a trim voltage on a trim voltage line 408 back to VDC 402.

The voltage signal on line 404 is supplied to a control electrode of a transistor 410 of internal voltage generator 406 to control a source-drain current through transistor 410. The source of transistor 410 may be coupled to receive the applied supply voltage VCCEXT. The current through transistor 410 is supplied to the other transistor of circuit 406 as shown in FIG. 1 to generate an internal voltage VCCINT available from a node 412. The trim voltage, a voltage used to vary the voltage out of VDC 402, is supplied to VDC 402 from node a 414 coupled to line 408.

To achieve a target internal voltage VCCINT, fuses F1–F4 may be selectively blown. The voltage at node 414 will then change, which will provide a different trim voltage to VDC 402. VDC 402 will output a different voltage to internal voltage generator 406 via line 404 in response to the different trim voltage. This different output voltage will cause the current through transistor 410 to change, which in turn will cause the outputted voltage VCCINT to change.

A problem with this type of generator is that once any of the fuses are blown, the generator cannot be re-trimmed to obtain certain other internal voltage levels. This is particularly a problem in manufacturing semiconductor devices. For example, prior to packaging an integrated circuit, it is subjected to full functional testing and a target internal voltage VCCINT is determined. Following the manufacture of wafers containing many replications of the integrated circuit, each wafer is tested for the desired internal voltage. If the internal voltage is not the desired voltage, the internal voltage generator may be trimmed to obtain that voltage. However, in the process of blowing fuses the desired internal voltage may accidentally be overshot, and the generator may be beyond re-trimming, depending on which fuses were blown. The die is then no good and will not be packaged after dicing, causing the yield rate to decrease.

If the prior art generator achieves the target internal voltage after trimming, the die may be subjected to full functional testing to determine other parameters of the integrated circuit. During this testing it may be determined that the target internal voltage must be adjusted, for example, due to the integrated circuit's sensitivity to that internal voltage VCCINT. The internal voltage VCCINT may not be trimmed, however, depending on which fuses were blown. Thus, the device may not perform optimally.

Therefore, it is a general object of the present invention to provide an improved voltage generator which overcomes the above-mentioned problems.

Another object of the present invention is to allow testing of all levels of the internal voltage VCCINT for each individual circuit.

A further object of the present invention is to provide a fuse programmable voltage down converter requiring a low chip area.

SUMMARY OF THE PRESENT INVENTION

This invention provides a fuse-programmable voltage converter that generates an internal voltage VCCINT, which may be used for full functional testing of a die over a range of voltages. Once the target internal voltage VCCINT is achieved for the circuit, the voltage converter can be configured to maintain the optimal internal VCCINT.

A preferred embodiment of the present invention includes a counter used to enable a range of voltages for trimming the internal voltage to be used for full functional testing of the circuit. A fuse circuit is provided to maintain an input to a voltage down converter once the target internal voltage VCCINT is determined. The voltage down converter is provided to output the target internal voltage VCCINT to the circuit.

A novel and important aspect of the operation of such voltage converter is its ability to provide a range of internal voltages VCCINT to be used for full functional testing to determine the target internal voltage VCCINT without blowing fuses.

Another important aspect of the preferred voltage converter is that it uses a minimum amount of circuitry, and thus requires low chip area.

The invention also includes a method for operating a fuse programmable voltage converter. A method of operating the converter may comprise the steps of: (1) passing a counter output and blocking a fuse circuit output; (2) supplying a range of voltage levels corresponding to the counter output for full functional testing of a die to determine the target internal voltage; and (3) blocking the counter output and passing the fuse circuit output that is configured to maintain the target internal voltage in conjunction with voltage down converter.

BRIEF DESCRIPTION OF THE DRAWINGS

The invention, together with its objects and the advantages thereof, may better be understood by reference to the following detailed description taken in conjunction with the accompanying drawings with which:

FIG. 9 is a schematic diagram of the internal voltage generator of FIG. 3;

FIG. 10 is a schematic diagram of the VDIVIDE circuit of the FIG. 3 embodiment;

DETAILED DESCRIPTION OF THE INVENTION

Figure 1:
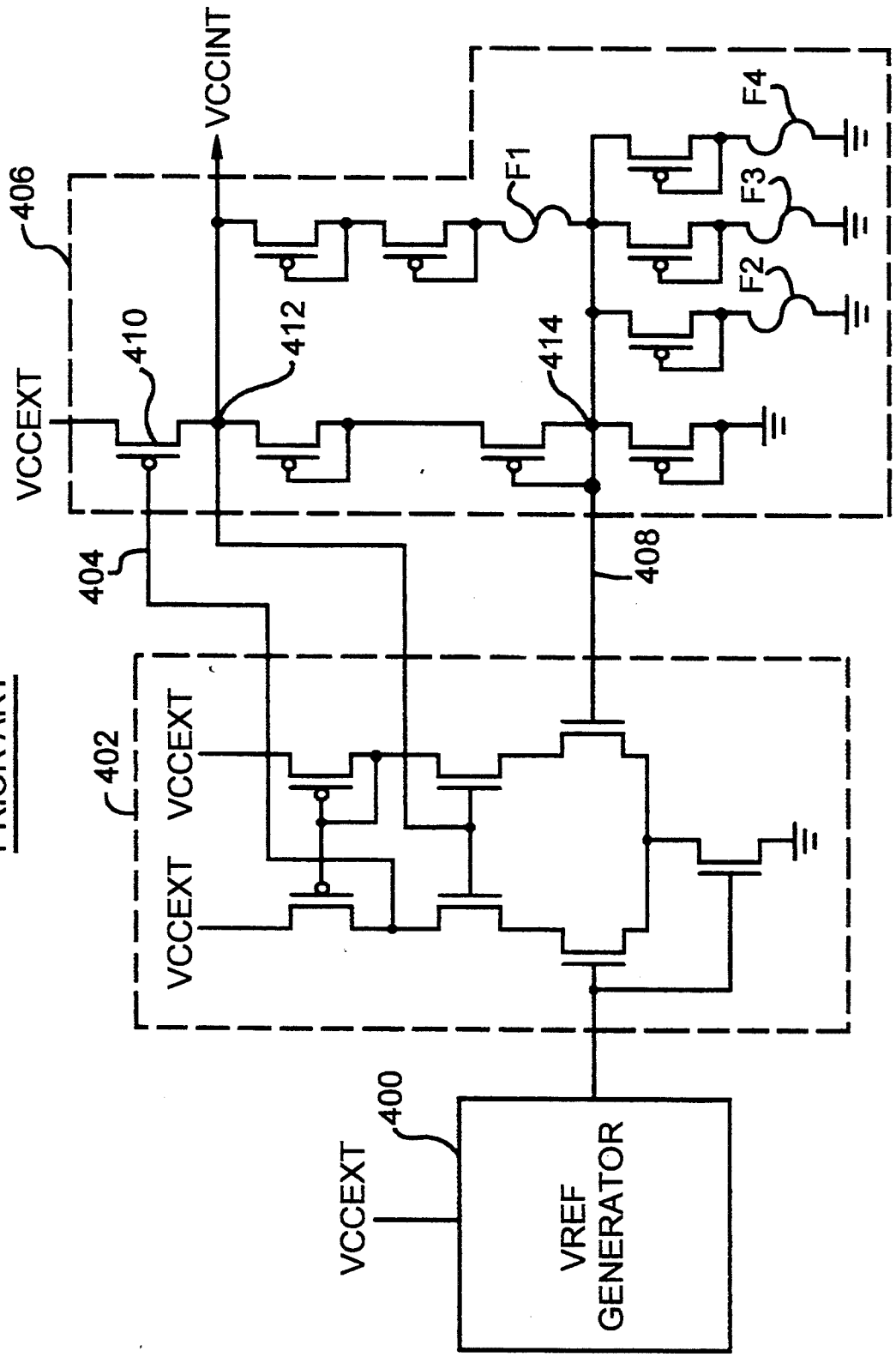
FIG. 1 is a detailed diagram of a prior art internal voltage generator.
Figure 2:
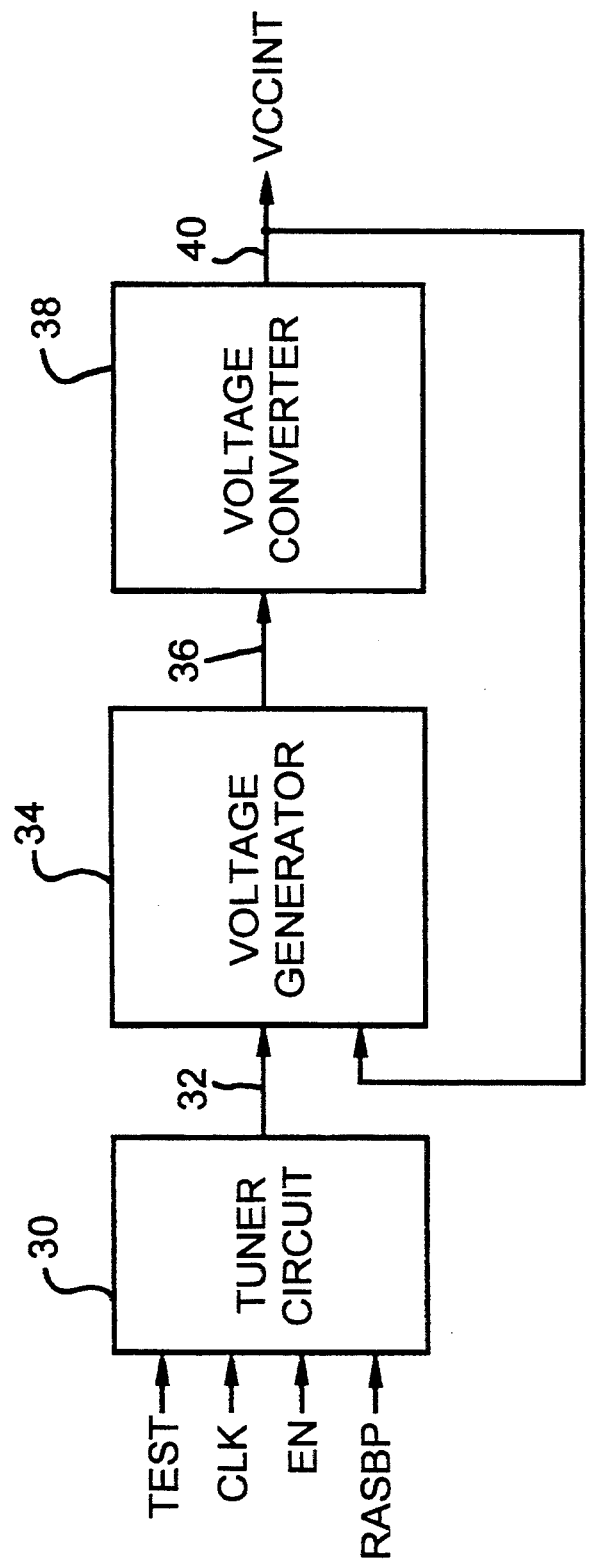
FIG. 2 is a block diagram of the present invention.

FIG. 2 is a block diagram of a circuit configured according to aspects of the present invention. It is coupled to receive signals TEST, EN, RASBP and CLK. Signals TEST, EN, RASBP and CLK are input to a tuner circuit 30. An output signal of tuner circuit 30 is supplied via a bus 32 to a voltage generator 34. An output signal of voltage generator 34 is supplied via a bus 36 to a voltage converter 38. Voltage converter 38 outputs an internal voltage VCCINT via a line 40. Line 40 is input to voltage generator 34.

Figure 3:
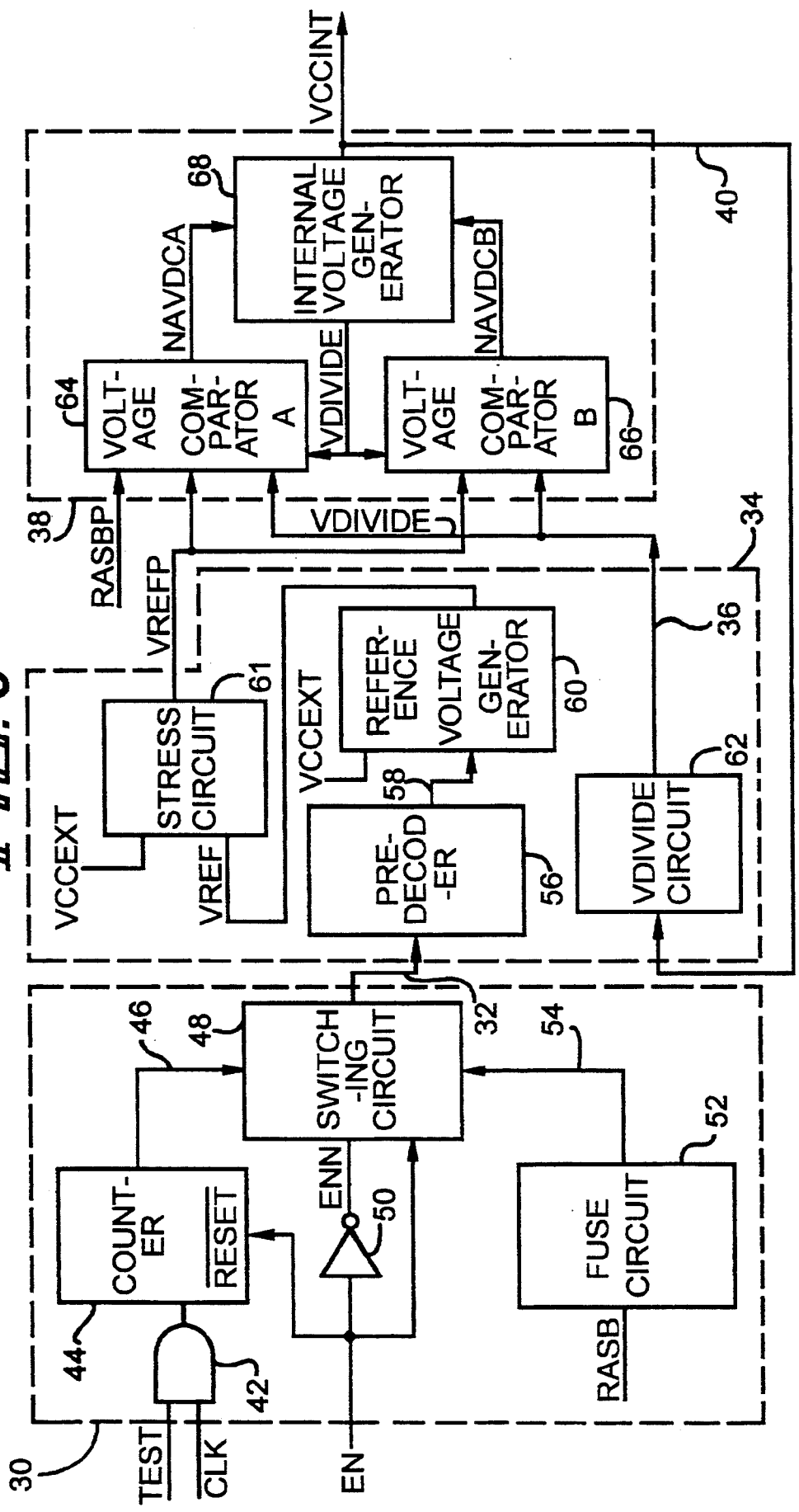
FIG. 3 is a detailed block diagram of a first embodiment of the FIG. 2 embodiment.

FIG. 3 is a more detailed block diagram of the preferred embodiment of the present invention. In FIG. 3, block 30 represents tuner circuit 30 of FIG. 2, block 34 represents voltage generator 34 of FIG. 2, and block 38 represents voltage generator 38 of FIG. 2.

Referring to block 30, signals TEST and CLK are input to a logic gate 42, preferably an AND gate. An output signal of logic gate 42 is supplied to a clock input of a counter 44. Signal EN is coupled to a reset input of counter 44.

An output signal of counter 44 is coupled by a count bus 46 to a switching circuit 48. Preferably, counter 44 is a conventional wrap-around counter with a four-bit output signal CB0-CB3, and count bus 46 is four bits wide. Signal EN is input to switching circuit 48 and to an inverter 50. Switching circuit 48 is coupled to receive an output signal ENN of inverter 50.

Signal RASBP is input to a fuse circuit 52. An output signal of fuse circuit 52 is supplied by fuse bus 54 to switching circuit 48. Preferably, fuse circuit 52 outputs a four-bit signal FB0-3 having the binary value 1,0,0,0, and fuse bus line 54 is four bits wide.

Referring to block 34, switching circuit 48 supplies an output signal via a bus 32 to an input of a predecoder circuit 56. Preferably, switching circuit 48 has a four-bit output signal COUNT0-3, and count bus 32 is four bits wide. A predecoder circuit 56 supplies an output signal via a trim bus 58 to a reference voltage generator circuit 60. Preferably, predecoder circuit 56 outputs an eight-bit signal TRIM0-7, and trim bus 58 is eight bits wide. Reference voltage generator circuit 60 is coupled to receive an external voltage VCCEXT. Circuit 60 supplies an output signal VREF to an input of a stress circuit 61.

A VDIVIDE circuit 62 is coupled to line 40 of an external voltage generator 68. VDIVIDE circuit 62 provides second voltage comparator 66 a signal VDIVIDE via a line of bus 36 to both voltage comparators 64 and 66. An output signal VREFP of stress circuit 61 is coupled in parallel to inputs of first and second voltage comparators 64 and 66 (block 38) via a line of bus 36. Alternatively, the present invention may be implemented without the stress circuit 61. Reference voltage generator circuit 60 would have its output signal VREFP supplied directly over bus 36 to both voltage comparators 64 and 66. First voltage comparator 64 is coupled to receive signal RASBP. It is also coupled to receive an output voltage VDIVIDE of circuit 62. Moreover, second voltage comparator 66 also is coupled to receive the output voltage VDIVIDE of circuit 62.

Internal voltage generator 68 is coupled to receive an output signal NAVDCA from first voltage comparator 64. It is also is coupled to receive an output signal NAVDCB from second voltage comparator 66. Internal voltage generator 68 outputs an internal voltage VCCINT on a line 40.

Figure 4:
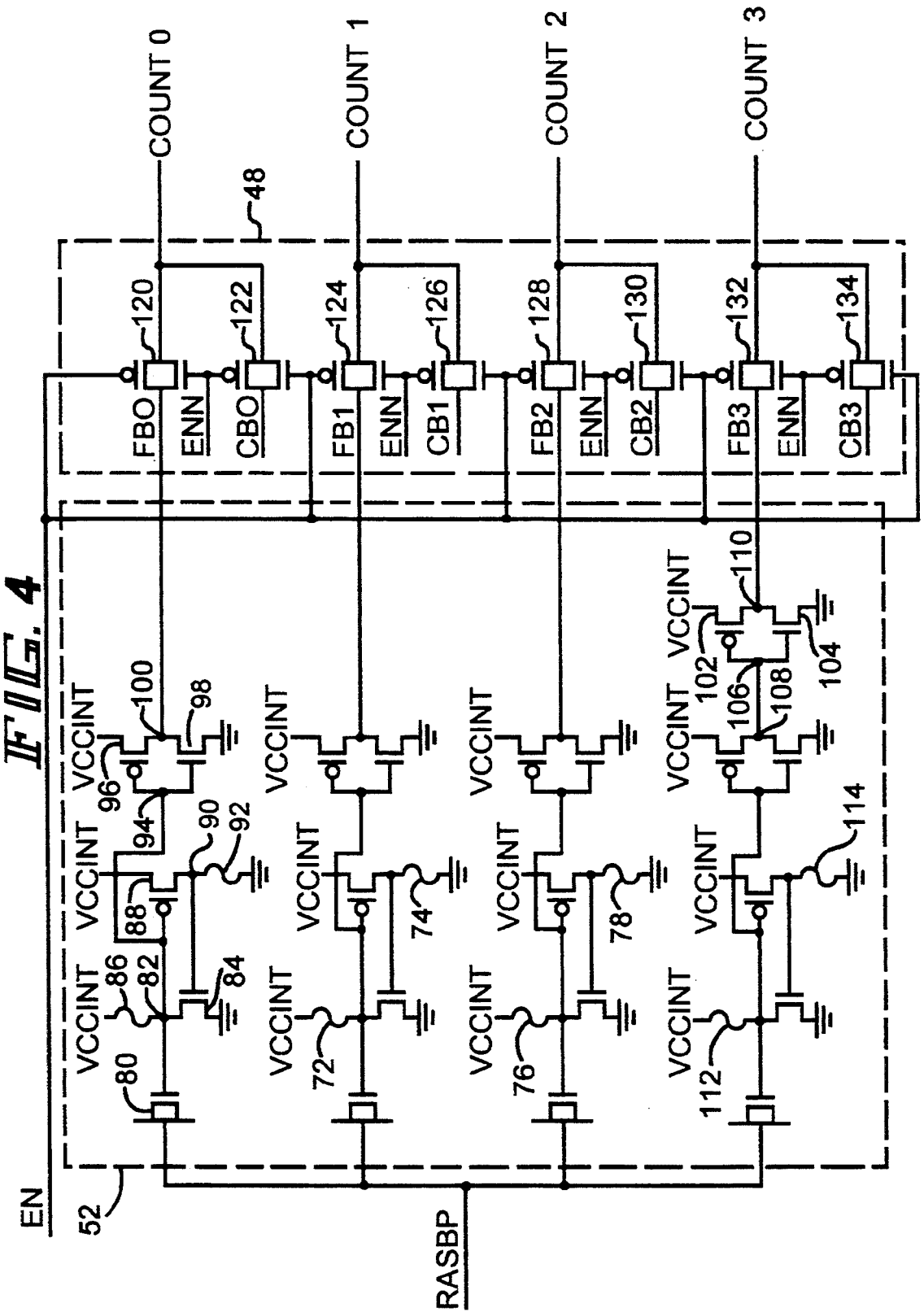
FIG. 4 is a schematic diagram of the switching circuit and the fuse circuit of FIG. 3.

FIG. 4 shows a detailed diagram of fuse circuit 52 and switching circuit 48. The circuit configuration of fuse circuit 52 will be explained in connection with one of its output signals FB0. (Other output signals of circuit 52 are FB1, FB2 and FB3). Referring to a block 52, signal RASBP is coupled to an electrode of a capacitor 80. Another electrode of capacitor 80 is coupled to a node 82. Node 82 is selectively coupled to a second power supply, such as ground, through a source-drain path of a transistor 84. Node 82 is fuse coupled to internal voltage VCCINT through a first fuse 86. Node 82 is coupled to a gate electrode of a transistor 88.

A gate electrode of transistor 84 is coupled to a node 90. Node 90 is fuse coupled to the second power supply via a second fuse 92. Node 90 is selectively coupled to internal voltage VCCINT through a source-drain path of a transistor 88.

Node 82 is coupled further to a node 94. Node 94 is coupled to gate electrodes of transistors 96 and 98. Transistors 96 and 98 function as an inverter having an output node 100. Node 100 conducts a fuse bit signal FB0 corresponding to a least significant digit of the fuse circuit 52 output signals FB0-3.

Circuitry to generate fuse bits FB1 and FB2 are identical to the circuitry described above for generating fuse bit FB0. Circuitry to generate fuse bit FB3 preferably contains the same components as that of the circuitry for the other fuse bits, plus an additional inverter formed by transistors 102 and 104. Circuitry for generating fuse bit FB3 also includes a node 106 that is coupled to a node 108. Node 108 has an analogous function to node 100. Node 106 is coupled to gate electrodes of transistors 102 and 104. An output node 110 is selectively coupled to internal voltage VCCINT through a source-drain path of transistor 102. Node 110 is selectively coupled to the second power supply through a source-drain path of transistor 104. Node 110 supplies fuse bit signal FB3.

The generation of the fuse circuit 52 output signal FB0–3 will be explained by describing the generation of output signal FB0. The voltage at node 82 is internal voltage VCCINT since fuse 86 couples node 82 to internal voltage VCCINT. Node 90 has a voltage equal to the voltage at the second power supply (e.g. VSS or ground) since fuse 92 couples node 90 to the second power supply. The internal voltage VCCINT at node 82 is supplied to the gate electrode of transistor 88, which does not turn it on since transistor 88 is preferably a p-channel transistor. Similarly, node 90 supplies a voltage VSS to the gate electrode of transistor 84, which does not turn on because it is an n-channel transistor. Therefore, node 82 maintains the internal voltage VCCINT.

Node 82 also supplies internal voltage VCCINT to node 94. Internal voltage VCCINT does not turn on p-channel transistor 96, but does turn on n-channel transistor 98. Turned on transistor 98 couples node 100 to the second power supply. Node 100 thus has a voltage VSS (i.e. ground voltage) that is supplied as first bit FB0.

If fuses 86 and 92 are blown (preferably either all or none of the fuses are blown for each bit), then nodes 82 and 90 are decoupled, respectively, from the internal voltage VCCINT and the second power supply. Nodes 82 and 90 are floating and now have an indeterminate voltage. This indeterminate voltage is supplied to transistors 96 and 98 via node 94. It is unknown what state transistors 96 and 98 will be in, and the state of output signal FB0 would be unknown.

To overcome this, signal RASBP is supplied to capacitor 80. While signal RASBP is inactive (high), node 82 will maintain its indeterminate state. After signal RASBP transitions to the active state (low), node 82 is pulled down to a maximum voltage of VSS through capacitor 80. The voltage at node 82 is supplied to transistor 88 which turns on. On transistor 88 couples node 90 to internal voltage VCCINT. The internal voltage VCCINT at node 90 is supplied to the gate of transistor 84, which turns on. On transistor 84 clamps node 82 to VSS.

The voltage VSS at node 82 is supplied to transistors 96 and 98 via node 94. Consequently, transistor 96 will be turned on and transistor 98 will remain off. On transistor 96 clamps node 100 to the internal voltage VCCINT to supply output signal FB0 as high. Circuitry for output signals FB1 and FB2 function the same way.

Circuitry for output signal FB3 includes node 108 that has the analogous function of node 100 for supplying first bit signal FB0. However, transistors 102 and 104 supply a voltage to node 110 that is the inverse of the voltage at node 108. Hence, when fuses 112 and 114 are not blown, the output signal FB3 at node 110 is high. When fuses 112 and 114 are blown, the output signal FB3 at node 110 is low.

The circuit to generate output signal FB3 is configured to preferably provide a high output when the fuses 112 and 114 are not blown. This is done so that an internal voltage VCCINT initially generated will have an intermediate value, such as shown by 260 in FIG. 12, before testing begins.

Switching circuit 48 of FIG. 3 will be explained with reference to block 48 of FIG. 4. Block 48 includes complementary pass gates 120, 122, 124, 126, 128, 130, 132 and 134. Each of the complementary pass gates includes p- and n-channel transistors coupled together. The drain of the n-channel transistor is coupled to the source of the p-channel transistor to form an input terminal for each respective complementary pass gate. The source of the n-channel transistor is coupled to the drain of the p-channel transistor to form an output terminal for each respective complementary pass gate. Complementary pass gates are used so that either a full VSS or internal voltage VCCINT will pass without the threshold voltages of either transistor having an effect.

The gates of the p-channel transistors of complementary pass gates 120, 124, 128 and 132, and the gates of the n-channel transistors of complementary pass gates 122, 126, 130 and 134 are coupled to receive enable signal EN. The gates of the p-channel transistors of complementary pass gates 122, 126, 130 and 134, and the gates of the n-channel transistors of complementary pass gates 120, 124, 128 and 132 are coupled to receive inverted enable signal ENN.

The inputs of complementary pass gates 120, 124, 128 and 132 are coupled to receive output signals FB0–3, respectively, from fuse circuit 52. The inputs of complementary pass gates 122, 126, 130 and 134 are coupled to receive output signals CB0–3 via count bus 46, respectively, from counter 44 (as shown in FIG. 3).

Enable signal EN and inverted enable signal ENN, respectively high and low, will turn on complementary pass gates 122, 126, 130 and 134 to supply output signals CB0–3 as COUNT0–3. Enable and inverted enable signals respectively low and high will turn on complementary pass gates 120, 124, 128 and 132 to supply output signals FB0–3 as COUNT0–3. Complementary pass gates 120 and 122, 124 and 126, 128 and 130, and 132 and 134 function to respectively multiplex inputs CB0–3 with FB0–3 as output signals COUNT0, COUNT1, COUNT2 and COUNT3. Signals COUNT0–3 are conducted on bus 32 shown in FIG. 3 to predecoder circuit 56.

Output signals FB0–3 and corresponding output signals CB0–3 are shown in Table 1. Table 1 shows which of fuses 72, 74, 76, 78, 86, 92, 112 and 114 are to be blown ("1") to produce the desired output signals FB0–3.

TABLE 1

| FB0-3 (Decimal) | FB3 FUSES | | FB2 FUSES | | FB1 FUSES | | FB0 FUSES | |
|---|---|---|---|---|---|---|---|---|
| | 114 | 112 | 78 | 76 | 74 | 72 | 92 | 86 |
| 0 | 1 | 1 | 0 | 0 | 0 | 0 | 0 | 0 |
| 1 | 1 | 1 | 0 | 0 | 0 | 0 | 1 | 1 |
| 2 | 1 | 1 | 0 | 0 | 1 | 1 | 0 | 0 |
| 3 | 1 | 1 | 0 | 0 | 1 | 1 | 1 | 1 |
| 4 | 1 | 1 | 1 | 1 | 0 | 0 | 0 | 0 |
| 5 | 1 | 1 | 1 | 1 | 0 | 0 | 1 | 1 |
| 6 | 1 | 1 | 1 | 1 | 1 | 1 | 0 | 0 |
| 7 | 1 | 1 | 1 | 1 | 1 | 1 | 1 | 1 |
| 8 | 0 | 0 | 0 | 0 | 0 | 0 | 0 | 0 |
| 9 | 0 | 0 | 0 | 0 | 0 | 0 | 1 | 1 |
| 10 | 0 | 0 | 0 | 0 | 1 | 1 | 0 | 0 |
| 11 | 0 | 0 | 0 | 0 | 1 | 1 | 1 | 1 |
| 12 | 0 | 0 | 1 | 1 | 0 | 0 | 0 | 0 |
| 13 | 0 | 0 | 1 | 1 | 0 | 0 | 1 | 1 |
| 14 | 0 | 0 | 1 | 1 | 1 | 1 | 0 | 0 |
| 15 | 0 | 0 | 1 | 1 | 1 | 1 | 1 | 1 |

Figure 5:
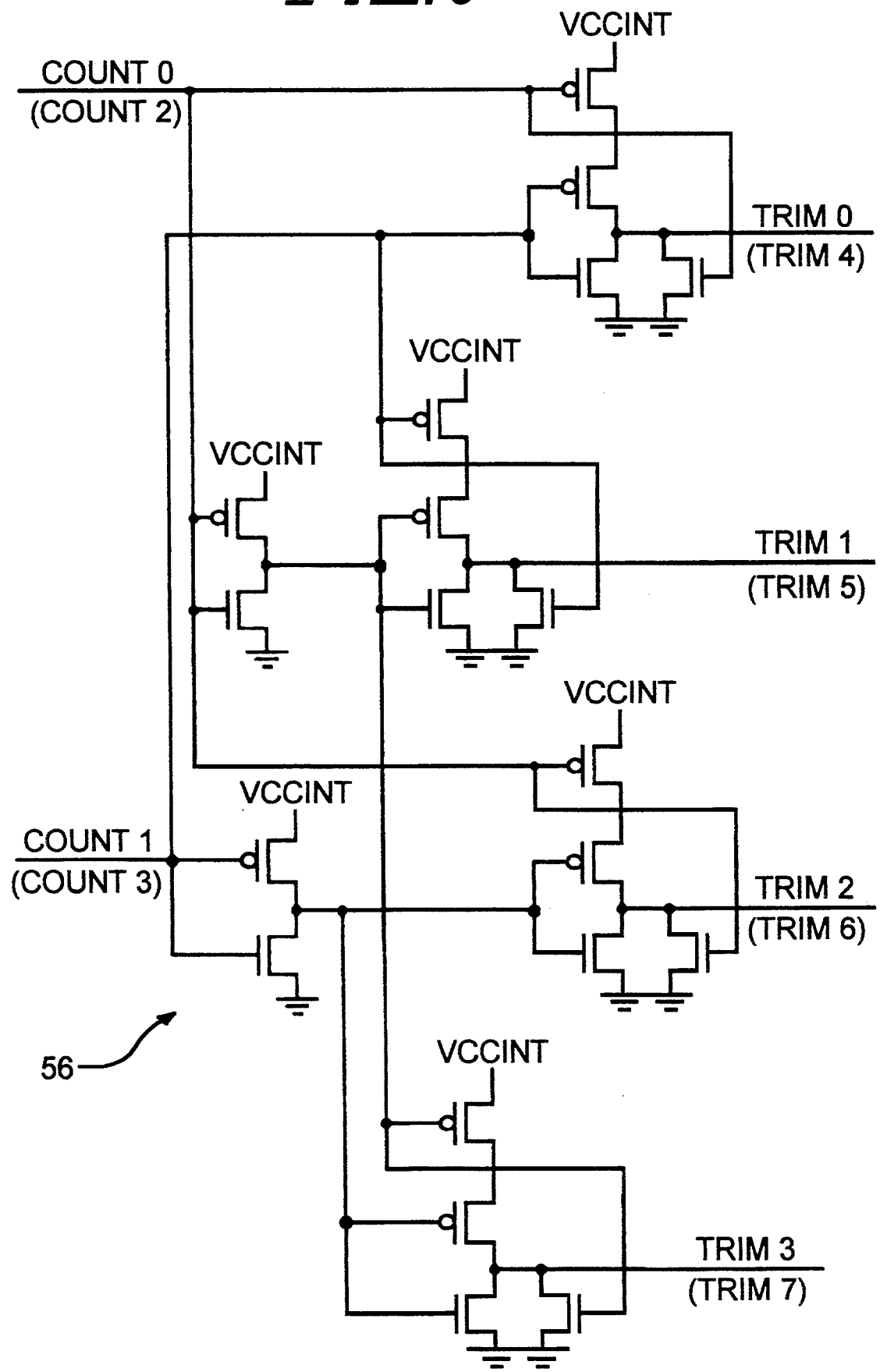
FIG. 5 is a schematic diagram of the predecoder circuit of FIG. 3.

Predecoder 56 shown in FIG. 3 will be explained with reference to FIG. 5. Predecoder 56 has two identical circuits as illustratively shown in FIG. 5. One of the circuits is coupled to receive signals COUNT0 and COUNT1, and outputs signals TRIM0 to TRIM3. The other circuit receives COUNT2 and COUNT3, and outputs signals TRIM4 to TRIM7 as parenthetically shown in FIG. 5. Hence, circuits as shown in FIG. 5 decide the COUNT signals and generate TRIM signals in response thereto. The input-output characteristics of the circuit are shown in Table 2.

TABLE 2

| INPUT | | OUTPUT | | | |
|---|---|---|---|---|---|
| COUNT1 (COUNT3) | COUNT0 (COUNT2) | TRIM0 (TRIM4) | TRIM1 (TRIM5) | TRIM2 (TRIM6) | TRIM3 (TRIM7) |
| 0 | 0 | 1 | 0 | 0 | 0 |
| 0 | 1 | 0 | 1 | 0 | 0 |
| 1 | 0 | 1 | 0 | 1 | 0 |
| 1 | 1 | 0 | 0 | 0 | 1 |

Note that fuse circuit 52 of FIG. 3 initially generates an output with no fuses blown (=8 as shown in Table 1). This causes internal voltage generator 68 to output a preferred medium internal voltage VCCINT as shown by 260 in FIG. 12.

Figure 6:
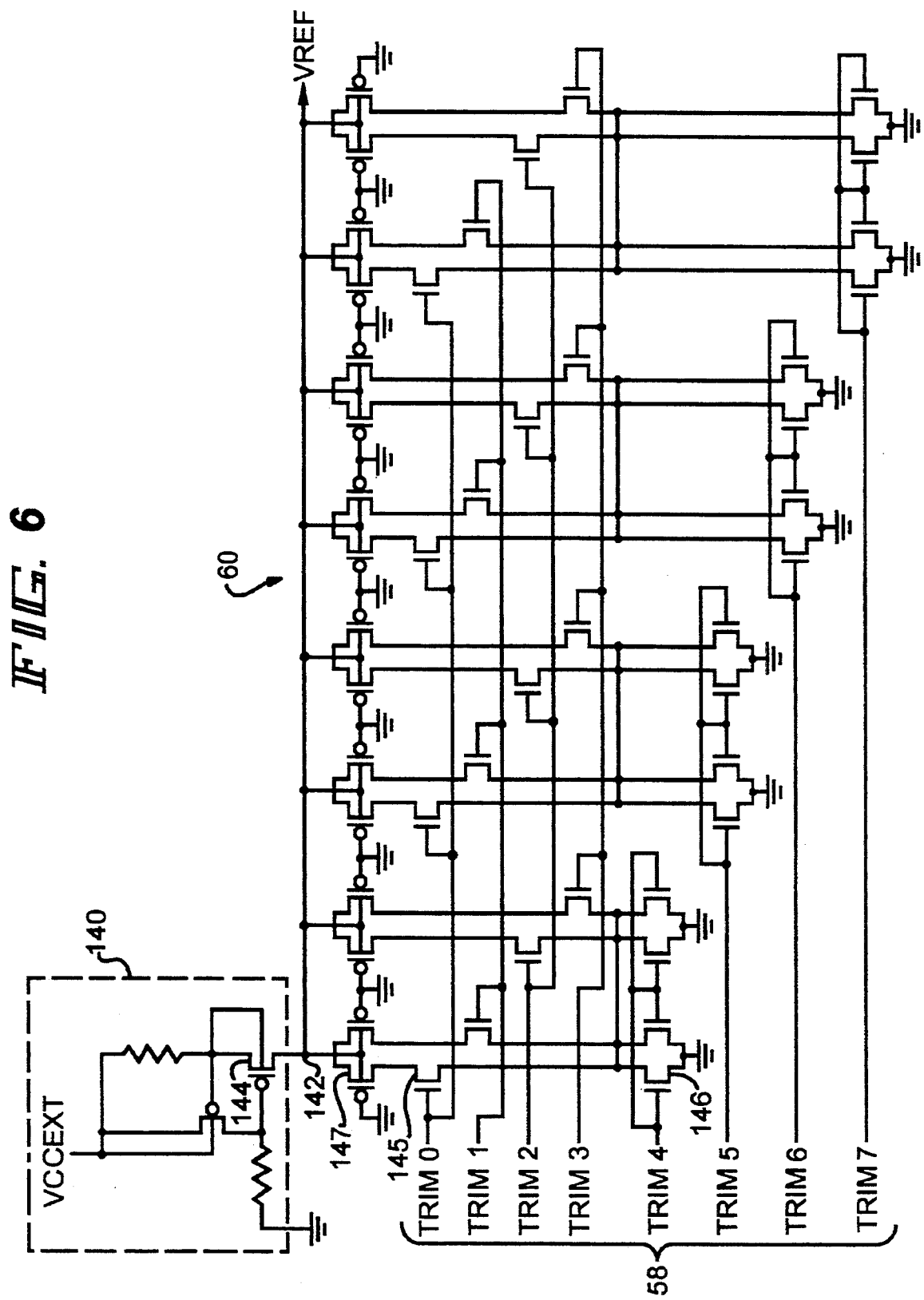
FIG. 6 is a schematic diagram of the reference voltage generator circuit of FIG. 3.

FIG. 6 shows the reference voltage generator circuit 60 of FIG. 3 in more detail. A block 140 includes transistors and resistors to provide a constant current source to a node 142. The constant current source will generate a corresponding voltage at node 142. The p-channel transistors shown in FIG. 6 preferably have their respective substrates coupled to a source providing a voltage equal to the voltage at node 142 to avoid latch-up and variation in the threshold voltage due to the body effect. For example, the substrate can be coupled directly to node 142. An additional transistor (not shown) may be coupled in parallel with transistor 144 in order to provide more current to node 142.

A circuit coupled to receive the constant current source from node 142 includes p- and n-channel transistors. Gates of the p-channel transistors are coupled to ground to maintain them in an on state. The n-channel transistors are coupled to receive respective signals TRIM0-7 from predecoder circuit 56 via trim bus 58 (shown in FIG. 3).

As seen in Table 2, preferably only two signals of signals TRIM0-7 are active at any one time. The two active signals activate their respective transistors in FIG. 6 to establish a path from a p-channel transistor to ground. A voltage VREF will be generated by the voltage drop from node 142 through the established path.

For example, when signals TRIM0 and TRIM4 are active (high), n-channel transistors 145 and 146 are turned on. Since a transistor 147 is configured to be one, a path is formed between node 142 and ground through transistor 145, 146 and 147. Current will flow through this path to generate and provide voltage VREF at node 142. Other transistors in FIG. 6 may have different dimensions and thus generate, when selected, a corresponding different voltage at node 142.

The stress mode circuit 61 shown in FIG. 3 preferably compares the voltage VREF supplied from reference voltage generator 60 to a voltage that is derived from VCCEXT. The greater voltage of the two will be output as VREFP. The circuit for stress mode circuit 54 may include the circuit as disclosed in co-pending application Ser. No. 07/983,328 filed Nov. 30, 1992 and owned by the assignees of the present invention. The circuit disclosed in that application includes two differential amplifiers to compare voltages VREF and the derivative of VCCEXT, and selectively provide the greater voltage of the two as the output VREFP via switches responsive to the output of the differential amplifiers. The circuit also preferably includes two voltage dividers to provide the derivative of VCCEXT to the differential amplifiers and to a switch.

In the preferred embodiment, the stress mode circuit disclosed in the co-pending application contains a power-up transistor in parallel with a transistor of one of the differential amplifiers. This transistor is used to power-up the stress circuit 61. It allows for current to bypass the transistor it is shunting during power-up. This allows the output of the differential amplifier having this transistor to initially output a high voltage. The high voltage is used to couple VREF to the output of stress circuit 61 to provide VREFP=VREF.

Stress circuit 61 may be omitted entirely. The output signal VREF of reference voltage generator circuit 60 may be coupled directly to the first and second voltage comparators 64 and 66 via a line of bus 36.

Figure 7:
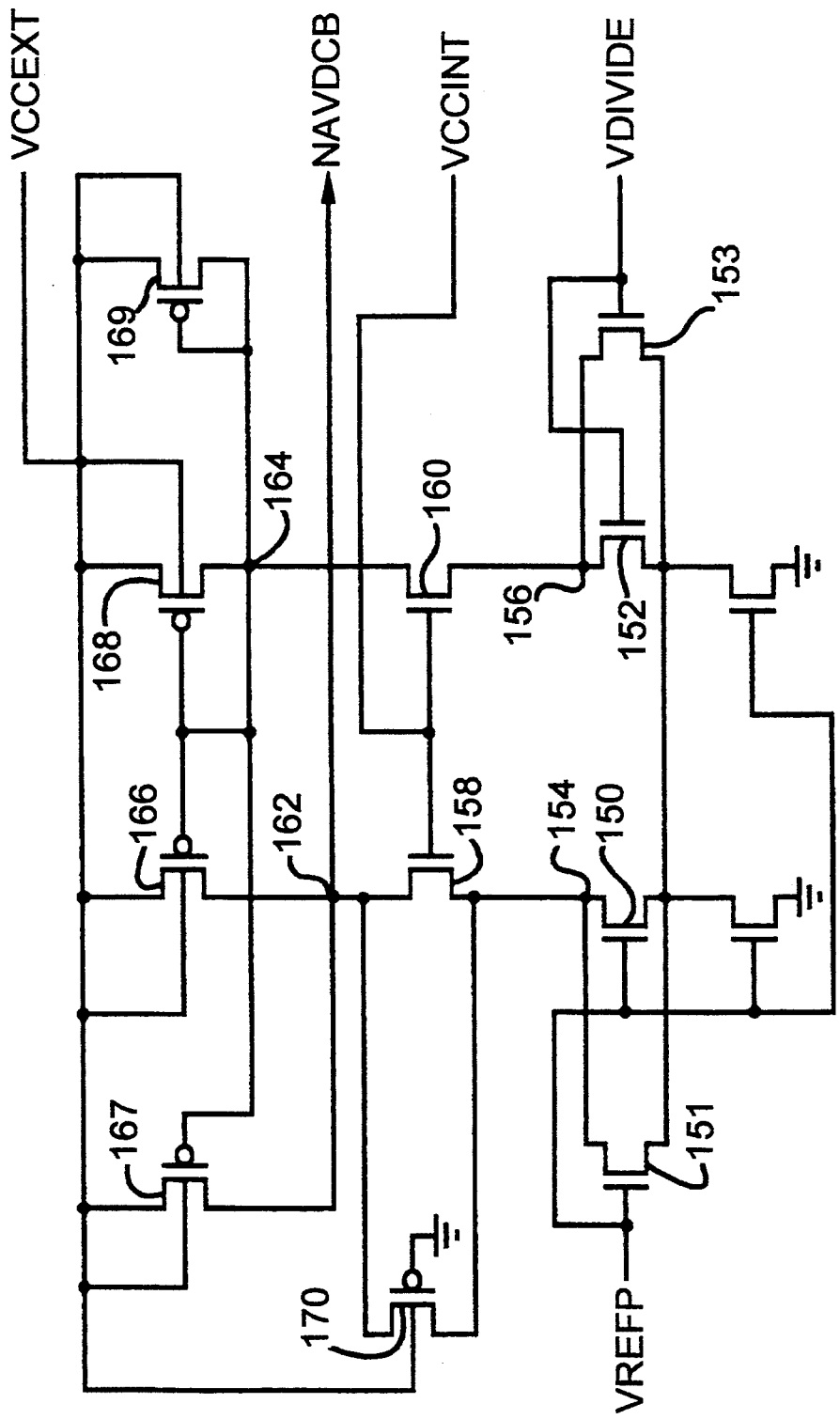
FIG. 7 is a schematic diagram of the second voltage comparator of FIG. 3.

Referring to FIG. 7, which is a detailed schematic of, and shows, second voltage converter B 66 coupled to receive the output signal VREFP of stress mode circuit 61. In the preferred embodiment, second voltage comparator 66 comprises a differential amplifier coupled to receive VREFP and a voltage VDIVIDE. The preferred embodiment of the present invention is configured so that voltage VDIVIDE tracks VREFP. The p-channel transistors 166, 167, 168 and 169 have their respective substrates coupled to VCCEXT to avoid latch-up.

While VREFP>VDIVIDE, transistors 150 and 151 will have a greater current drive capability (i.e. allow more current to pass) than transistors 152 and 153. The greater current drive capability pulls a voltage at a node 154 lower than a voltage at a node 156. The lower voltage at node 154 creates a greater positive voltage difference between the gate and source electrodes of transistor 158 than the voltage difference between the gate and source electrodes of transistor 160. This greater voltage difference causes transistor 158 to conduct more current than transistor 160. A voltage at a node 162 will be pulled down to a voltage less than a voltage at a node 164. The voltage at node 162 is output as a signal NAVDCB. Signal NAVDCB is low when VREFP>VDIVIDE.

In the instance where VREFP<VDIVIDE, the current drive capabilities of transistors 150, 151 and 158 are less than the current drive capabilities of transistors 152, 153 and 160. The voltage at node 164 will be less than the voltage at node 162. The voltage at the gate electrode of transistor 166 will be the same as the voltage at node 164 since they are coupled together. The signal NAVDCB will be pulled high.

Transistor 170 is used as a power-up transistor for the circuit in FIG. 7. When powering up the preferred embodiment of the present invention, transistor 170 allows current to bypass transistor 158. This pulls the voltage at node 162 lower than the voltage at node 164.

If transistor 170 were not used, upon power-up the voltage at node 162 and voltage of signal NAVDCB would be unknown. The preferred embodiment of the present invention requires NAVDCB to power up with a low voltage. Additionally, transistor pairs 150 and 151, 152 and 153, 166 and 167, and 168 and 169 can be replaced by one transistor per pair. The sizes of the transistors can be varied to obtain the desired current through the circuit.

Transistors 158 and 160 in FIG. 7 are coupled between the other transistors to prevent a voltage drop VCCEXT-VSS across transistors 150, 151, 152 and 153, respectively. This is preferred since the present embodiment is using transistors of such small dimensions that a large voltage drop across the transistors (VCCEXT-VSS) may cause punch through or gated diode breakdown.

Figure 8:
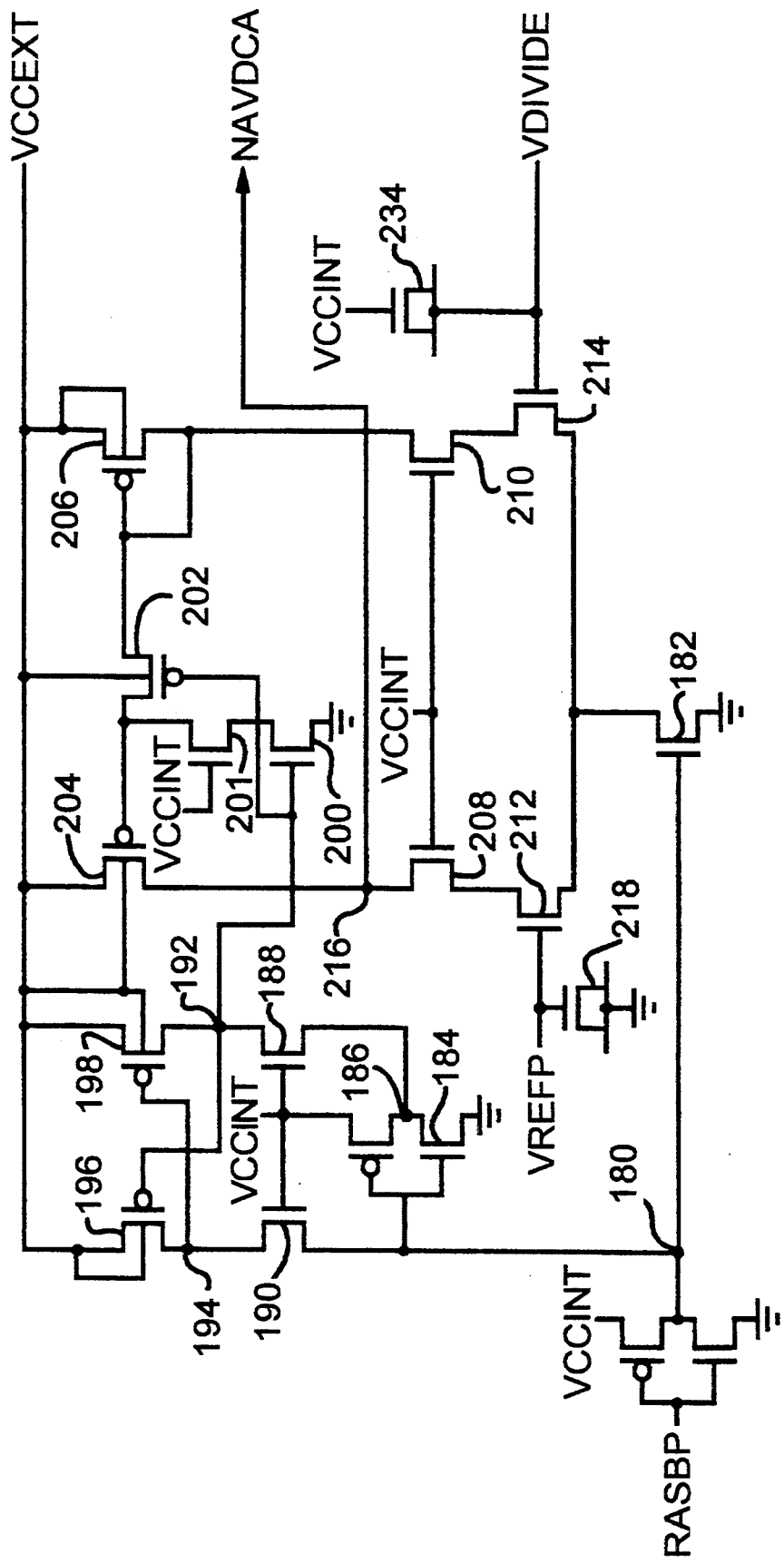
FIG. 8 is a schematic diagram of the first voltage comparator of FIG. 3.

First voltage comparator 64 of FIG. 3 will be explained by referring to FIG. 8. The circuit of FIG. 8 is coupled to receive signal VREFP, signal VDIVIDE and signal RASBP. Signal RASBP enables the circuit of FIG. 8 when there is a heavy current demand, such as a read of a memory. Signal RASBP, active low, is preferably generated by the user in response to this demand. P-channel transistors 196, 198, 202, 204 and 206 have their respective substrates coupled to their respective source electrodes to avoid latch-up.

A voltage at a node 180 is high when signal RASBP is active (low). Transistors 182 and 184 are turned on. A node 186 is pulled low through the source-drain path of transistor 184. The voltage difference between the gate and source electrodes of transistor 188 is greater than the voltage difference between the gate and source electrodes of transistor 190. Transistor 188 will have a greater current drive capability than transistor 190 which will pull down a voltage at node 192. A voltage at node 194 is greater than the voltage at node 192 since transistor 190 has less current drive capability than transistor 188. Additionally, the voltage at node 194 will be greater than the voltage at node 192 since the voltage at the gate electrode of transistor 196 equals the voltage at node 192 (the voltage at node 192 is less than the voltage at node 194). Thus transistor 196 will pass more current and node 194 will be pulled towards a voltage VCCEXT.

Transistor 198 will not be passing much current since the voltage difference between its gate and source electrodes is greater than that of transistor 196. Therefore, the voltage at node 192 will be further pulled towards ground. The low voltage at node 192 turns off transistor 200. The low voltage at node 192 turns on transistor 202 to couple the gate electrodes of transistors 204 and 206 together.

Transistors 182, 204, 206, 208, 210, 212 and 214 form a differential amplifier. This differential amplifier operates as explained above for the FIG. 7 differential amplifier. A voltage at a node 216 decreases when VREFP>VDIVIDE and increases when VREFP<VDIVIDE. A signal NAVDCA follows the voltage at node 216. Transistors 208 and 210 are used to insure that there is not a large voltage drop, such as 5 V, across any one transistor. This will eliminate any punch through.

While RASBP is inactive (high), its inverted signal at node 180 is low to turn off transistor 182. Off transistor 182 disables the differential amplifier. Node 180 is also coupled to an inverter having an output node 186, so when RASBP is high, node 186 is also high. The high voltage at node 186 turns off transistor 188 because both the gate and source electrode of transistor 188 have the same voltage. Transistor 190 is on, which pulls node 194 low. The voltage at node 194 is supplied to the gate of transistor 198 to increase the current drive capability of transistor 198 (i.e. render it more conductive). This in turn will pull the voltage at node 192 high. When the voltage at node 192 is high, it turns off transistor 202 to decouple the gate electrodes of transistors 204 and 206 from one another. The high voltage at node 192 also turns on transistor 200 which pulls the gate electrode of transistor 204 to ground.

The low voltage at the gate of transistor 204 makes it more conductive and hence increases its current drive capability. The voltage at node 216 and output signal NAVDCA are pulled high. Transistor 202 is used so that when RASBP is inactive, the low voltage at the gate electrode of transistor 204 is not supplied to the gate electrode of transistor 206. If this occurred (i.e. transistor 204 is either on or not used), transistor 206 would have an increased current drive capability. Current from VCCEXT would pass through transistors 206, 204 (if used), 201 and 200 to ground. This current would be wasted and would decrease power efficiency.

A capacitor 218 has a first terminal coupled to the gate electrode of transistor 212. This first terminal is coupled to receive voltage VREFP. A second terminal of capacitor 218 is coupled to the second power supply (e.g. ground). Capacitor 218 is used to maintain voltage VREFP substantially stable at the gate electrode of transistor 212.

Because of the structure of transistor 212, there are parasitic capacitances between the gate electrode and the source and drain electrode, respectively. The gate electrode is capacitively coupled to the source and drain electrodes. When the voltage at either the drain or source electrode changes, the capacitive coupling tries to change the voltage at the gate electrode. To counter this capacitive coupling effect, capacitor 218 is made sufficiently larger than either parasitic capacitance. The voltage VREFP will then remain substantially stable.

FIG. 9 shows the internal voltage (VCCINT) generator 68. A block 220 illustratively includes multiple p-channel transistors. These transistors are controlled by signal NAVDCA, which is coupled to their gate electrodes. They are inactive in stand-by mode to insure low power consumption. When there is a demand for current, these transistors become active and provide the extra current responsive to the signal NAVDCA. The p-channel transistors in FIG. 10 preferably have their respective substrates coupled to VCCEXT to avoid latch-up.

A block 222 illustratively includes other p-channel transistors which are controlled by signal NAVDCB. These transistors are always active when the chip is powered up.

A block 224 illustratively includes multiple capacitors connected in parallel to store charge. The charge is supplied to any circuit coupled to receive internal voltage VCCINT.

Referring to FIG. 10, transistors 226 and 228 are supplied with current from blocks 220 and 222 of FIG. 9. Internal voltage VCCINT is provided at a source electrode of transistor 226. Transistors 226 and 228 create a voltage divider circuit which provides voltage VDIVIDE at a node 232 to substantially maintain internal voltage VCCINT constant.

When internal voltage VCCINT changes magnitude, voltage VDIVIDE follows. However, because of long channel lengths needed to have low stand by current of transistors 226 and 228, voltage VDIVIDE will not change as quickly as internal voltage VCCINT. To overcome this slow response, FIG. 8 shows a capacitor 234 coupled between internal voltage VCCINT and voltage VDIVIDE. When internal voltage VCCINT changes, capacitor 234 initially forces voltage VDIVIDE to change the same amount as that of internal voltage VCCINT. Subsequently, transistors 226 and 228 (as shown in FIG. 10) adjust voltage VDIVIDE to its new voltage.

Operation of FIG. 3

An overview of the operation of the FIG. 3 embodiment is as follows. Signals TEST and CLK are gated together to increment the output of counter 44 as determined by a user. Switching circuit 48 will couple either outputs of counter 44 or fuse circuit 52 as COUNT0-3 to predecoder circuit 56 as input signals. The coupling is responsive to the state of signal EN, also determined by the user.

Predecoder circuit 56 decodes the input signals (COUNT0-3) and supplies the decoded signals (TRIM0-7) to reference voltage generator circuit 60. Reference voltage generator circuit 60 uses the decoded signals to generate a corresponding reference voltage VREF.

Reference voltage generator circuit 60 supplies the reference voltage VREF to stress circuit 61. Stress circuit 61 outputs VREFP, which may be equal to the input reference voltage VREF. Or VREFP may be a voltage equal to a ratio of VCCEXT, which is preferably greater than the reference voltage VREF. Alternatively, stress circuit 61 may be omitted. In such a case, reference voltage generator 60 provides reference voltage VREF to both voltage comparators 64 and 66.

VREFP is supplied to both voltage comparators 64 and 66. These voltage comparators compare signal VREFP to signal VDIVIDE supplied by VDIVIDE circuit 62. Their respective outputs, NAVDCA and NAVDCB, will vary according to the comparison of VREFP and voltage VDIVIDE. Voltage VDIVIDE is used as feedback generated from internal voltage VCCINT which is output from the internal voltage generator 68. For example, when there is a large current demand on line 40 in FIG. 3, internal voltage VCCINT and voltage VDIVIDE will decrease. Decreased voltage VDIVIDE will cause the differential amplifiers in FIGS. 7 and 8 (if on (RASBP=0)) to decrease the voltage of signals NAVDCA and NAVDCB. Decreased voltages of signals NAVDCA and NAVDCB will cause the p-channel transistors in blocks 220 and 222 in FIG. 8 to pass more current to line 40 to meet the current demand.

NAVDCA and NAVDCB are applied as inputs to internal voltage generator 68. Internal voltage generator 68 generates internal voltage VCCINT responsive to those inputs. Again, VDIVIDE circuit 62 outputs the voltage VDIVIDE to the first and second voltage comparators 64 and 66 to adjust signals NAVDCA and NAVDCB to provide for the current demands on line 40 and to maintain internal voltage VCCINT substantially constant.

Second Embodiment

Figure 13:
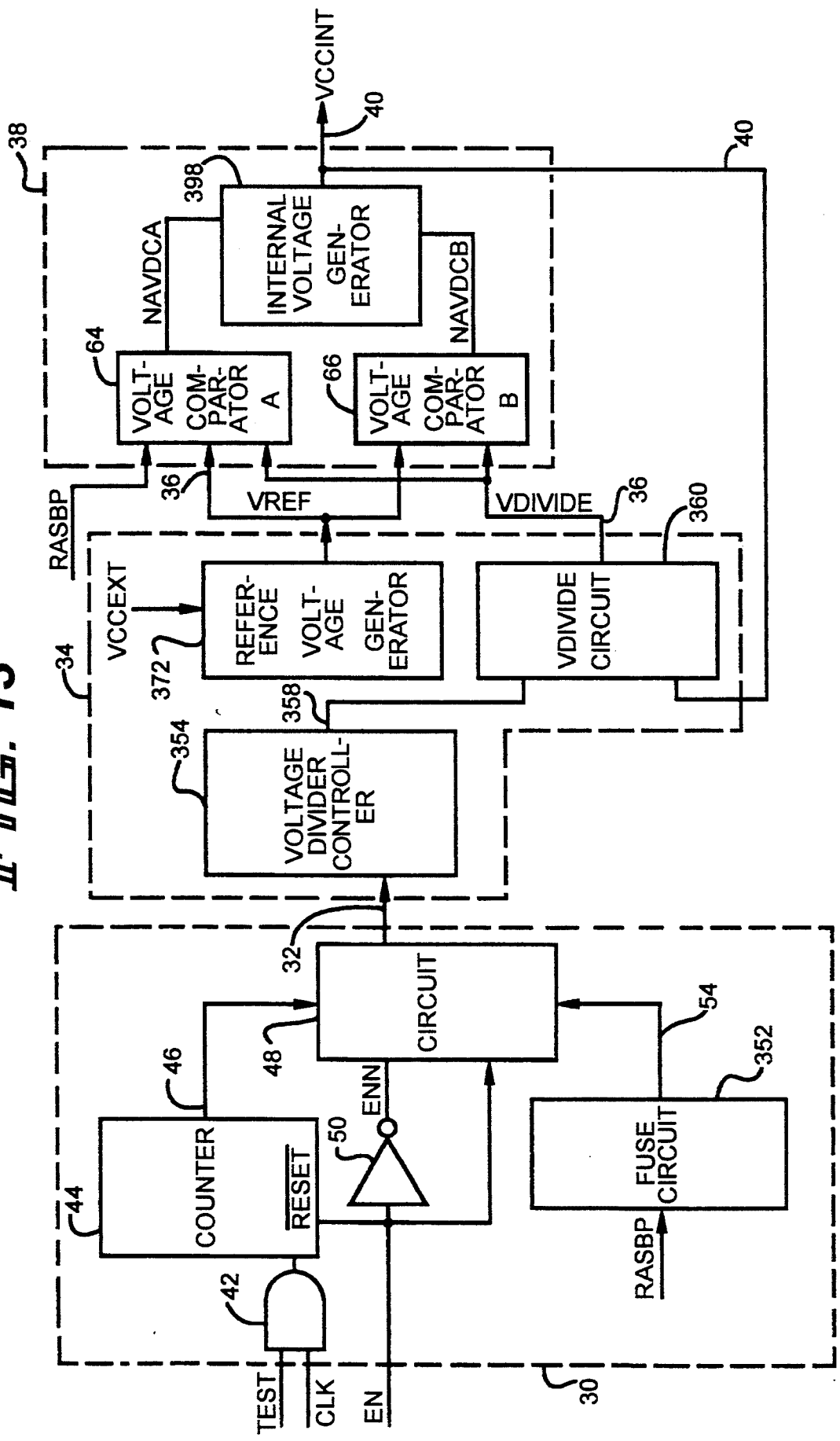
FIG. 13 is a detailed block diagram of a second embodiment of the present invention.

FIG. 13 shows a second embodiment of the present invention. Structures in this second embodiment that are the same as structures in the preferred embodiment have the same numbers and their explanations are not repeated.

FIG. 13 illustrates a second embodiment which, like the first embodiment, conforms to FIG. 2. Signals TEST and CLK are input to a logic circuit or gate 42, preferably an AND gate or a logic gate with an AND function. An output of logic gate 42 is supplied to a clock input of a counter 44. Signal EN is coupled to a reset input of counter 44.

An output signal of counter 44 is coupled by a count bus 46 to a switching circuit 48. Preferably, counter 44 is a conventional wrap-around counter with a four-bit output signal CB0-CB3, and count bus 46 is four bits wide. Signal EN is input to switching circuit 48 and to an inverter 50. Switching circuit 48 is coupled to receive an output signal ENN of inverter 50.

Signal RASBP is input to a fuse circuit 352. An output of fuse circuit 352 is supplied by fuse bus 54 to switching circuit 48. Preferably, fuse circuit 352 outputs a four-bit signal FB0-3 and fuse bus line 54 is four bits wide. Fuse circuit 352 has the same structure as fuse circuit 52 in FIG. 4 except transistors 102 and 104 are omitted. Initially (when no fuses have been blown), fuse circuit 352 outputs a 4-bit parallel signal having binary value 0,0,0,0.

Switching circuit 48 supplies signals COUNT0-3 via a count bus 32 to an input of a voltage divider controller 354. Preferably, switching circuit 48 has a four-bit output, and count bus 32 is four bits wide.

Figure 14:
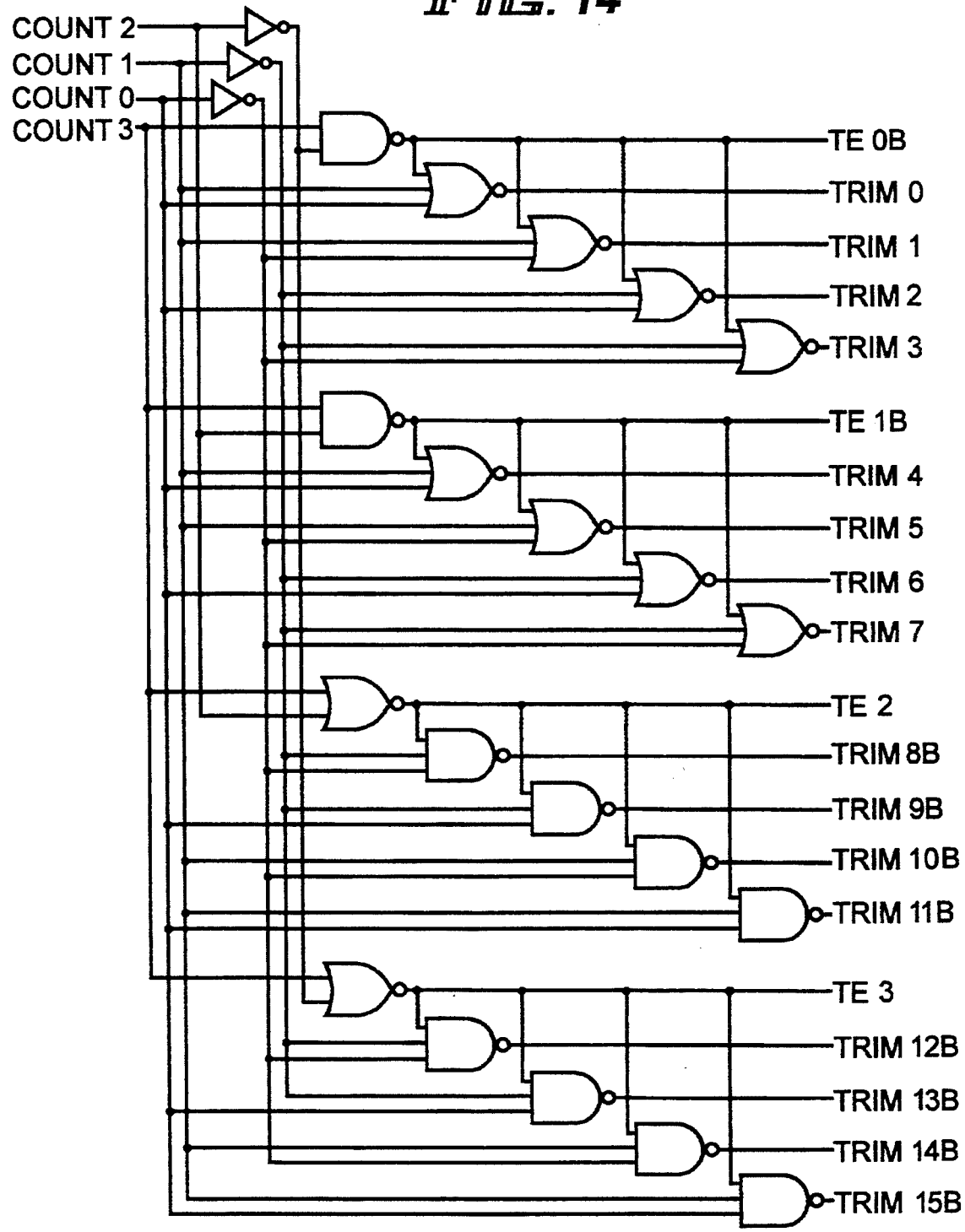
FIG. 14 is a schematic diagram of the voltage divider controller of FIG. 13.

Controller 354 will be described by referring to FIG. 14. The four-bit output signal from switching circuit 48 is input to a logic gate array as shown in FIG. 14. The states of the four bits of signals COUNT0-3 are decoded by the logic gate array to render preferably only one of trim signals TRIM0-7 AND TRIM 8B-15B active, and one of the four trim enable signals TE0B, TE1B, TE2 and TE3 active. Trim signals TRIM0-7 and trim enable signals TE2-3 are preferably high when active. Trim signals TRIM 8B-15B and trim enable signals TE0B-1B are preferably low when active.

Preferably, voltage divider controller 354 outputs a twenty-bit signal (trim bus 358 is twenty bits wide) to a VDIVIDE circuit 360. It is preferred that only one of trim enable signals TE0B, TE1B, TE2 and TE3 is active at any one time. VDIVIDE circuit 360 is coupled to receive internal voltage VCCINT from a current controller 400 via line 40.

Figure 15:
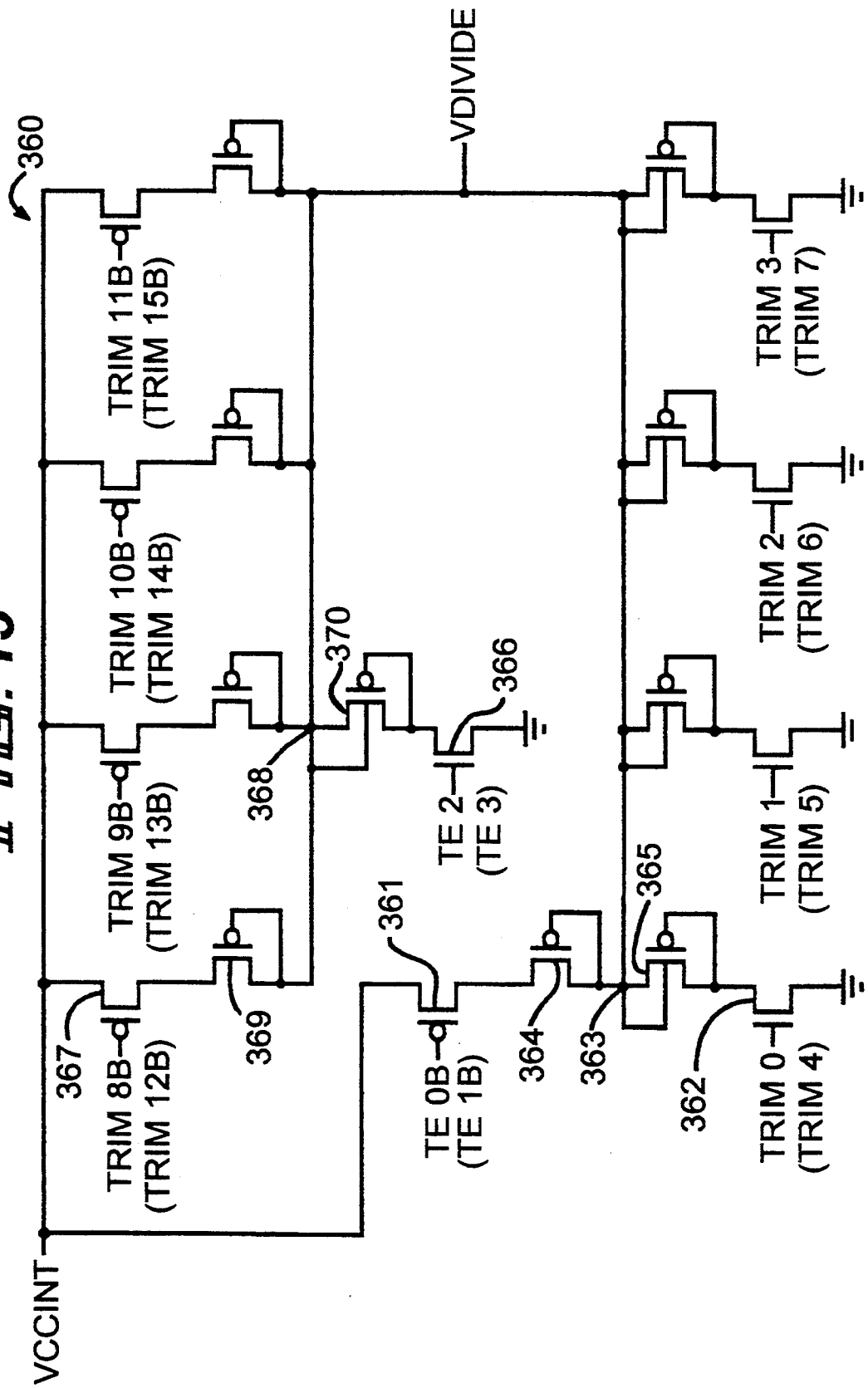
FIG. 15 is a schematic diagram of the voltage divider of FIG. 13.

Referring to FIG. 15, VDIVIDE circuit 360 will be explained. VDIVIDE circuit 360 has two identical circuits as illustratively shown in FIG. 15. One of the circuits is coupled to receive signals TRIM0-3, TRIM8B-11B, TE0B and TE2. The other circuit receives TRIM4-7, TRIM12B-15B, TE1B and TE3 as parenthetically shown in FIG. 15.

The operation of FIG. 15 will be illustratively explained for active signals TE0B and TRIM0, and TE2 and TRIM8B. Active signals TE0B and TRIM0 (low and high, respectively) turn transistors 361 and 362 on. Transistors 364 and 365 are configured to be on. A voltage signal VDIVIDE will be generated at a node 363 by current passing through transistors 361, 364, 365 and 362. Voltage signal VDIVIDE is a ratio of internal voltage VCCINT and is preferably dependent mainly on sizes of transistors 364 and 365.

While TE2 and TRIM8B are active (high and low, respectively), transistors 366 and 367 are on. Transistors 369 and 370 are configured to be on. A voltage VDIVIDE will be generated at a node 368 by current through transistors 366, 367, 369 and 370. Voltage VDIVIDE is a ratio of internal voltage VCCINT and is preferably dependent mainly on the sizes of transistors 369 and 370.

VDIVIDE circuit 360 supplies voltage VDIVIDE via bus 36 to voltage comparators 64 and 66. Voltage comparators 64 and 66, which are the same as the ones used in the preferred embodiment (FIGS. 7 and 8, respectively), are coupled to receive a reference voltage from reference voltage generator 372.

Figure 16:
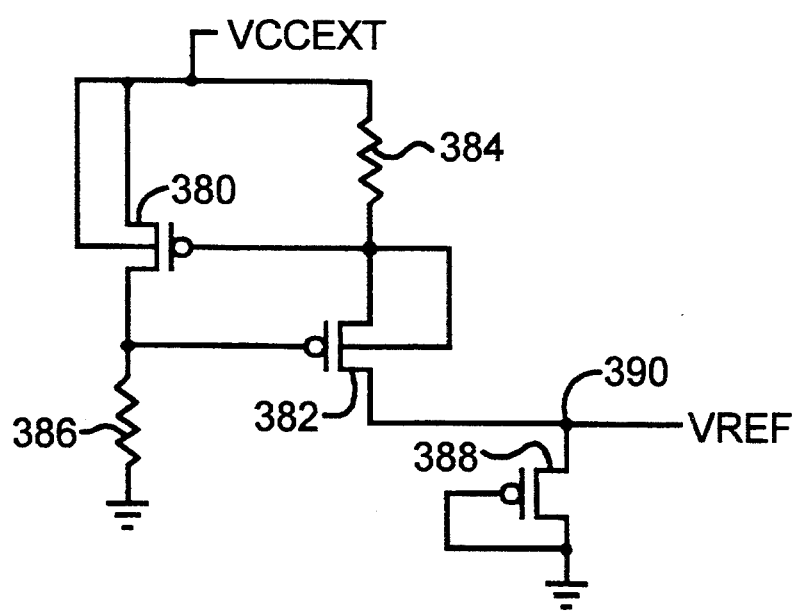
FIG. 16 is a schematic diagram of the reference voltage generator of FIG. 13.

FIG. 16 shows reference voltage generator 372. The circuit including transistors 380 and 382, and resistors 384 and 386 is coupled to receive external voltage VCCEXT to provide a constant current to transistor 388. The current passing through transistor 388, which is configured to be on, will generate reference voltage VREF at a node 390. Transistors 382 and 388 may have varying sizes depending on the desired value of reference voltage VREF. Additional transistors may be respectively used in parallel to transistors 382 and 388 to achieve a desired reference voltage VREF.

First and second voltage comparators 64 and 66 provide signals NAVDCA and NAVDCB, respectively, to an internal voltage generator 398. VCCINT generator 398 includes the same structures as blocks 220, 222, and 224. Internal voltage generator 398 outputs internal voltage VCCINT, which is also provided to VDIVIDE circuit 360.

Operation—Second Embodiment

Figure 12:
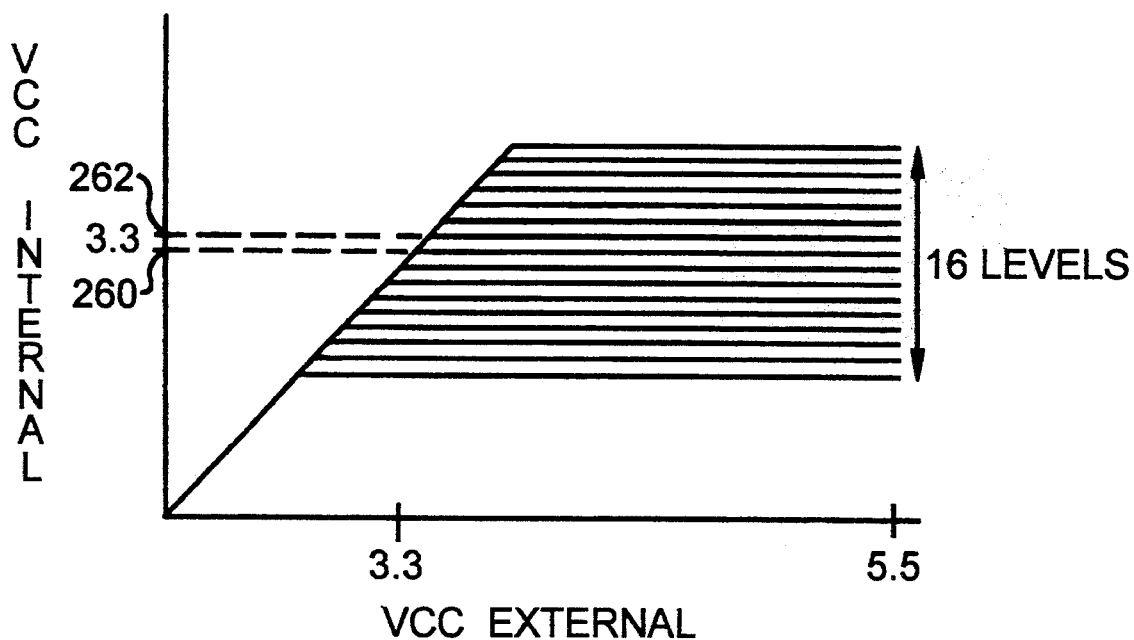
FIG. 12 is a graph of the internal voltage generated by the FIG. 2 embodiment.

An overview of the operation of the FIG. 12 embodiment is as follows. Signals TEST and CLK are gated together to increment the output of counter 44. Counter 44 is incremented at the user's discretion. Switching circuit 48 will couple either outputs of counter 44 or fuse circuit 352 to voltage divider controller 354 as input signals. The coupling is responsive to the state of signal EN which is set by the user.

Voltage divider controller 354 decodes the input signals COUNT0-3 to supply decoded signals TRIM-0-7, TRIM8B-15B, TEOB, TE1B, TE2 and TE3 to VDIVIDE circuit 360. VDIVIDE circuit 360 uses the decoded signals to generate a corresponding voltage VDIVIDE which is a variable ratio of internal voltage VCCINT.

VDIVIDE circuit 360 supplies voltage VDIVIDE to both voltage comparators 64 and 66. These voltage converters compare VREF (provided by reference voltage generator 372) to voltage VDIVIDE. Voltage VDIVIDE is derived from internal voltage VCCINT. Their respective output signals NAVDCA and NAVDCB vary according to the comparison of VREF and voltage VDIVIDE. For example, when there is a large current demand on line 40, internal voltage VCCINT and voltage VDIVIDE will decrease. Decreased voltage VDIVIDE will cause the differential amplifiers in first voltage comparator 64 (if on) and second voltage comparator 66 to decrease the voltage of signals NAVDCA and NAVDCB. Decreased voltages of signals NAVDCA and NAVDCB will cause the p-channel transistors in internal voltage generator 398 to pass more current to line 40 to meet the current demand, and to maintain internal voltage VCCINT substantially constant.

Signals NAVDCA and NAVDCB are input to internal voltage generator 398. Internal voltage generator 398 and VDIVIDE circuit 360 generate internal voltage VCCINT responsive to signals NAVDCA and NAVDCB. VDIVIDE circuit 360 outputs voltage VDIVIDE to first and second voltage comparators 64 and 66 to adjust signals NAVDCA and NAVDCB to provide for the current demands at line 40.

Use of the FIG. 2 Embodiment

Figure 11:
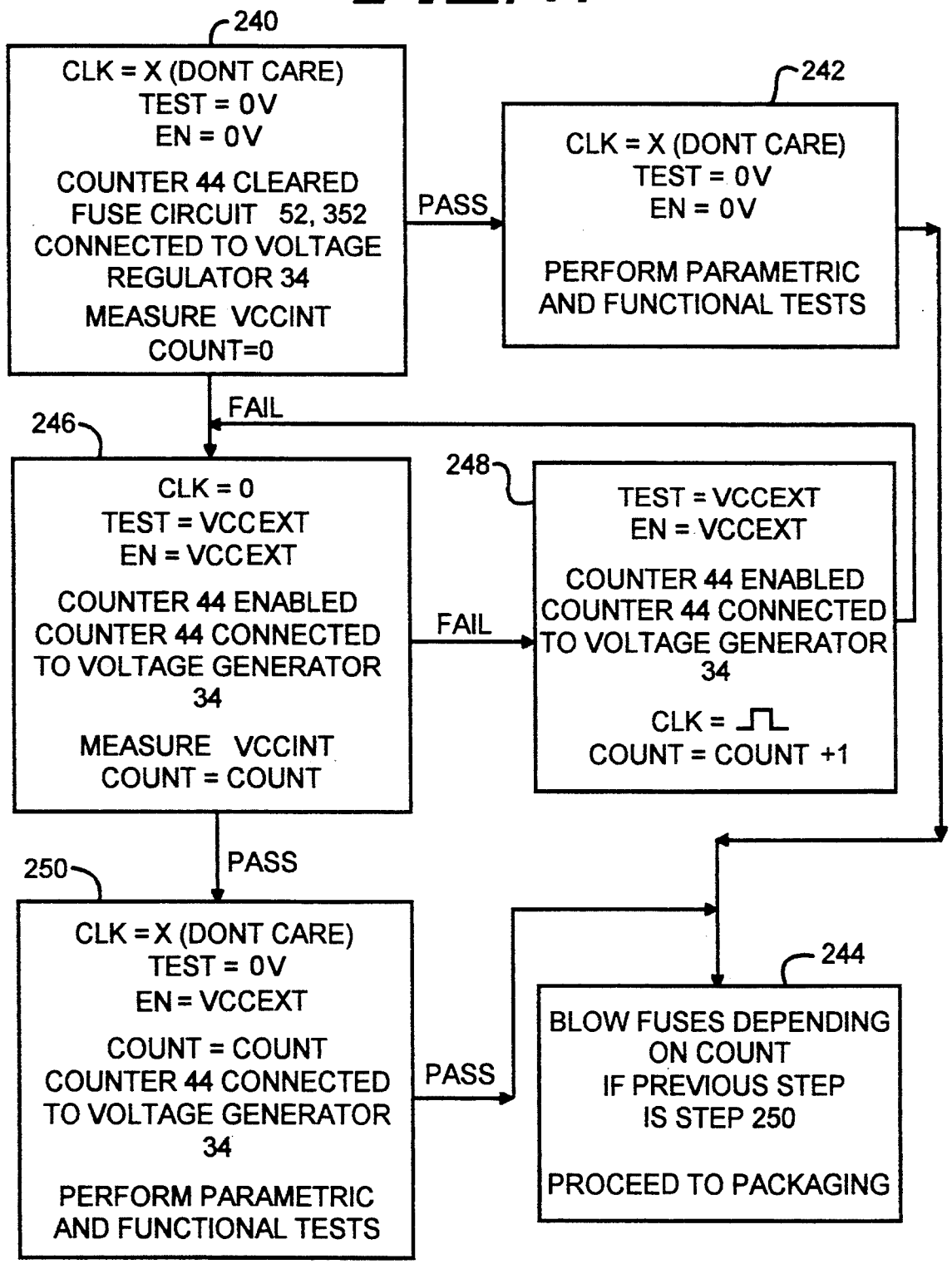
FIG. 11 is a flow chart diagram of the use of the FIG. 2 embodiment.

A detailed description of the use of the FIG. 2 embodiment will now be explained by referring to FIG. 11. FIG. 11 represents a flow chart for a general chip production testing procedure. Block 240 indicates that signal CLK is in a "don't care" state. Signals TEST and EN are inactive (low). Counter 44 (FIGS. 3 and 13) is cleared by low signal EN. Low signal EN enables switching circuits 48 and 348 (shown in FIG. 3 and 13, respectively) to provide the output of fuse circuit 52 and 352, respectively.

Internal voltage VCCINT is generated responsive to the output of fuse circuit 52 and 352. Internal voltage VCCINT is measured as required by block 240. If internal voltage VCCINT is the target internal voltage for a tested die, then the test proceeds to a block 242. There, the die on the wafer is subjected to parametric and functional testing. Parametric testing includes measuring standby and active current, for example. Functional testing may include testing the timing of the die, and writing and reading logic states to and from an array. If this testing is successful, the test proceeds to a block 244. Since internal voltage VCCINT has been measured to be the target voltage, no fuses need to be blown. Subsequently, the wafer proceeds to be diced, and the dies packaged. If any die fails the parametric or functional testing, the die is marked and discarded.

If internal voltage VCCINT is not the target internal voltage (block 240), then the test proceeds to a block 246. There, signal CLK is inactive (low), and signals TEST and EN are active (high). Active signal TEST enables the counter by allowing signal CLK to pass through logic gate 30. Active signal EN causes switching circuit 48 and 348 to stop providing the output of fuses circuits 52 and 352. Switching circuits 48 and 348 provide the output of counter 44. Active signal EN also allows the counter to be incremented.

An internal voltage VCCINT is generated in response to the output of counter 44. Internal voltage VCCINT is measured to determine if it is the target internal voltage. If it is not the target internal voltage, then the test proceeds to a block 248.

At block 248, signal CLK is pulsed active to preferably increment counter 44 by one. The incremented counter 44 output causes a higher internal voltage VCCINT to be generated as shown by block 248 in FIG. 11. Then the test returns to block 246 to test if internal voltage VCCINT is the target internal voltage. If it is not the internal voltage, then the test proceeds to block 248 to increment counter 44. This is done until internal voltage VCCINT is the target internal voltage.

Once internal voltage VCCINT obtains the target internal voltage, the test proceeds to a block 250. There, signal CLK is in a "don't care" state. Signal TEST is inactive (low) which disables the counter 44 from incrementing. Signal EN remains active (high) to keep switching circuits 48 and 348 providing the output of counter 44. The dies are subjected to parametric and functional testing. If the dies fail these other tests, they are discarded or otherwise handled.

If the dies pass these tests, then the test proceeds to a block 244. The fuses in fuse circuits 52 and 352 are blown to maintain the output of switching circuits 48 and 348 corresponding to the count that generates the target internal voltage VCCINT. Switching circuits 48 and 348 are controlled to output signals FB0-3 from fuse circuits 52 and 352. Then the wafer is diced, and the resulting dies are packaged. If the dies were in an initial phase of testing to determine the target internal voltage VCCINT, then if the die fails the parametric testing in block 242, the flow chart may proceed to block 246. Here, counter 44 is incremented until a target internal voltage VCCINT is discovered.

Another benefit of the preferred embodiment of the present invention is that the target internal voltage VCCINT is achieved by using counter 44. A prior art generator integrated on a wafer requires the tester to remove the wafer and configure the fuses to generate the next internal voltage. Then, the tester must return to the testing station to measure the internal voltage. This process may be repeated several times to obtain the desired internal voltage. This slows down the manufacturing process. Using the preferred embodiment obviates the need to remove the wafer to adjust the internal voltage. The tester merely increments the counter.

Once the internal voltage is achieved, the wafer is then fully functionally tested. If the prior art generator is integrated on the wafer, and the wafer is determined to have sensitivity to that internal voltage VCCINT, the tester may or may not be able to trim the internal voltage further, depending on which fuses were blown. If the wafer is integrated with the preferred embodiment of the present invention, then the tester can adjust the counter so that the internal voltage is adjusted to another value to further the functional tests. Not only is manufacturing time and testing time saved, but a higher yield of the wafers may be achieved.

It will be understood that in the adjustment or trim process, a first internal voltage VCCINT can be generated using a first count signal. The manufacturer may have predetermined that the target internal voltage VCCINT is some particular voltage. Then a simple comparison is made to see whether the first internal voltage VCCINT is near enough to the predetermined voltage to be accepted. If not, adjustment is made by changing the count to produce a second internal voltage VCCINT.

Alternatively, a range of internal voltage VCCINT values may be potentially acceptable and the die or chip can be fully tested at each internal voltage VCCINT value resulting from the count signal. Then the count signal can be adjusted and a second set of fully functional tests can be performed. This process is reiterated and then one internal voltage VCCINT (with the corresponding count) can be selected and locked into place.

Thus, it will be appreciated that the voltage converter 38 output internal voltage VCCINT is trimmed without blowing any fuses. Instead, a corresponding condition is temporarily and adjustably provided. After each single adjustment of the temporary circuit (the counter configuration), a test is performed. The counter may be advanced in single counts or in multiple counts, as desired. The counts may advance and they retreat (if an up-down counter were used) to focus or converge on whichever count leads to the optimum internal voltage VCCINT. After the best count, or a count that produces acceptable results has been determined, the temporary circuit is replaced with a permanent one that corresponds thereto.

Counter 44 and fuse circuits 52 and 352 may have more or fewer outputs. It is preferred that the maximum count value of counter 44 is "15". Incrementing the counter 44 when its output is "15" will force counter 44 to roll over to zero. This is a useful feature since the user can roll over the counter 44 if it is incremented too far without having to also set EN to reset counter 44.

Other embodiments may not have predecoder 46 or voltage divider controller 354, but instead directly couple the output signal of switching circuits 48 and 348 to reference voltage generator circuit 52 and voltage divider 360, respectively.

It should be appreciated that one aspect of the present invention, adding a counter to a voltage comparator, requires little chip area because it utilizes only a counter, a switch circuit, and some logic gates. This calls for only a minimal size increase.

Capacitors illustratively shown in the figures are preferably transistors configured with their respective source and drain electrodes coupled together to form one terminal of the capacitor. The gate electrode forms the other terminal of the capacitor.

The transistors illustratively shown in the figures may be manufactured to have different sizes to alter the current flow through them. Further, transistors may have other transistors coupled in parallel with them to provide extra current drive capability. These parallel transistors may be connected or disconnected during wafer fabrication.

It will be understood that either the voltage VREF or voltage VDIVIDE can be trimmed to provide the various internal voltage VCCINT.

It should be appreciated that the foregoing description is directed to preferred embodiments of the present invention, and that numerous modifications or alterations can be made without departing from the spirit or scope of the present invention.

What we claim as the invention is:

1. A fuse programmable voltage converter circuit comprising:
    a first circuit configured to provide at least one count signal, the first circuit being adjustable so that the at least one count signal may selectively be increased and decreased;
    a second circuit coupled to receive said at least one count signal to provide at least one reference voltage corresponding to said at least one count signal; and
    a third circuit coupled to receive said at least one reference voltage to provide an internal voltage corresponding to said at least one reference voltage.

2. A circuit as in claim 1 wherein said first circuit includes:
    a counter;
    a fuse circuit; and
    a switching circuit coupled to receive respective output signals of said counter and said fuse circuit, and coupled to said second circuit to provide said count signal so that the counter is selectively and non-permanently couplable to the second circuit.

3. A circuit as in claim 1 wherein said second circuit includes a reference voltage generator coupled to said first and third circuits.

4. A circuit as in claim 3 wherein said second circuit further includes a predecoder circuit coupled between said first circuit and said reference voltage generator.

5. A circuit as in claim 4 wherein said second circuit further includes a stress circuit coupled between said reference voltage generator and said third circuit.

6. A circuit as in claim 1 wherein said third circuit includes:
    at least one voltage comparator coupled to said second circuit; and an internal voltage generator circuit coupled to receive an output signal of said at least one voltage comparator to generate said internal voltage, said at least one voltage comparator being coupled to receive an output signal of said internal voltage generator circuit.

7. A circuit as in claim 6 wherein said third circuit further includes another voltage comparator coupled to said second circuit and coupled to receive said output signal of said internal voltage generator circuit, and wherein said internal voltage generator circuit is coupled to receive an output signal of said another voltage comparator to generate said internal voltage.

8. A circuit as in claim 7 further comprising a voltage divider coupled between said internal voltage generator and at least one of said voltage comparators.

9. A circuit as in claim 1 wherein said circuit is an integrated circuit.

10. A circuit as in claim 1 wherein said second circuit includes a voltage divider coupled to said first and third circuits.

11. A circuit as in claim 10 wherein said second circuit further includes a voltage divider controller coupled between said first circuit and said voltage divider.

12. A circuit as in claim 1 wherein said third circuit includes:
- at least one voltage comparator coupled to said second circuit and coupled to receive a reference voltage; and
- an internal voltage generator coupled to receive an output from said at least one voltage comparator and coupled to said second circuit, said internal voltage generator providing said internal voltage.

13. A circuit as in claim 12 wherein said third circuit further includes another voltage comparator coupled to said second circuit and to said internal voltage generator, and coupled to receive said reference voltage.

14. A circuit as in claim 11 wherein said second circuit further includes a reference voltage generator to provide said reference voltage to said at least one voltage comparator, and is coupled to receive an external voltage.

15. A fuse programmable voltage comparator circuit comprising:
- a counter coupled to receive clock and clear signals;
- a fuse circuit coupled to receive a power-up signal;
- a switching circuit coupled to receive respective output signals of said counter and said fuse circuit;
- a reference voltage generator coupled to receive an output signal of said switching circuit;
- a voltage comparator coupled to receive an output signal of said reference voltage generator; and
- an internal voltage generator circuit coupled to receive said output signal of said voltage comparator to generate an internal voltage in response to said output signal of said voltage comparator, said voltage comparator coupled to receive an output signal of said internal voltage generator circuit.

16. A circuit as in claim 15 further including a predecoder coupled between said switching circuit and said reference voltage generator.

17. A circuit as in claim 15 further comprising a stress circuit coupled to receive said output signal of said reference voltage generator and coupled to said voltage comparator.

18. A circuit as in claim 15 further comprising another voltage comparator coupled to receive said power-up and output signals of said reference voltage generator and said internal voltage generator circuit, said internal voltage generator circuit coupled to receive an output signal of said another voltage comparator.

19. A fuse programmable voltage converter circuit comprising:
- a counter having inputs for receiving clock and reset signals;
- a fuse circuit coupled to receive an enable signal;
- a switching circuit coupled to receive respective output signals of said counter and said fuse circuit;
- a voltage divider coupled to receive an output signal of said switching circuit;
- at least one voltage comparator coupled to receive an output signal of said voltage divider; and
- an internal voltage generator coupled to receive an output signal of said at least one voltage comparator to generate an internal voltage corresponding to said output signal of said voltage comparator, said voltage comparator coupled to receive an output signal of said internal voltage generator circuit.

20. A circuit as in claim 19 further including a voltage divider controller coupled between said switching circuit and said voltage divider.

21. A circuit as in claim 19 further comprising another voltage comparator coupled to receive said power-up and output signals of said voltage divider and said internal voltage generator, said internal voltage generator coupled to receive an output signal of said another voltage comparator.

22. A fuse programmable voltage converter circuit comprising:
- a voltage generator coupled to receive an input signal, said input signal having at least one bit that is adjustable to be incremented and decremented;
- at least one voltage comparator coupled to receive a voltage output signal of said voltage generator; and
- an internal reference voltage generator circuit coupled to receive an output signal of said at least one voltage comparator and coupled to provide an output signal, said voltage comparator coupled to receive an output of said internal reference generator.

23. A circuit as in claim 22 further comprising:
- a fuse circuit; and
- a switching circuit coupled to receive an output signal of said fuse circuit and said input signal, said voltage generator circuit being coupled to said switching circuit.

24. A method for operating a fuse programmable voltage comparator comprising the steps of:
- supplying a counter output;
- outputting an internal voltage corresponding to said counter output;
- determining whether said internal voltage is equal to a target value;
- repeatedly supplying at least another counter output if said internal voltage is not the target value until the target value is obtained;
- inhibiting said supplying of said counter output if said internal voltage is the target value; and
- supplying a programmed output substantially equal to said counter output if said internal voltage is the target value.

25. The method of claim 24 further comprising the steps of:
- supplying a fuse circuit output before said supplying the counter output;

outputting another internal voltage corresponding to said fuse circuit output before said supplying the counter output; and determining whether said another internal voltage corresponding to said fuse circuit output is said target value, said counter output being supplied if said another internal voltage is not said target value.

26. An internal voltage generator on an integrated circuit comprising:

a counter coupled to receive at least one input signal, said counter being adjustable to provide a counter output that can be increased and decreased;

a fuse circuit coupled to receive at least one input signal; and a voltage generator and converter circuit coupled to selectively receive either outputs of said counter or fuse circuit to provide a variable voltage output, so that the counter output is selectively coupled to the voltage generator and converter circuit;

whereby the counter output is adjusted to provide temporarily the desired voltage output and the fuse circuit is then used to provide the desired voltage output permanently.

* * * * *